United States Patent [19]

Hudson, Jr.

[11] 4,087,146

[45] May 2, 1978

[54] FLAT FLEXIBLE CABLE SURFACE MOUNT CONNECTOR ASSEMBLY

[75] Inventor: William Jeffrey Hudson, Jr., Hershey, Pa.

[73] Assignee: AMP Incorporated, Harrisburg, Pa.

[21] Appl. No.: 709,031

[22] Filed: Jul. 27, 1976

[51] Int. Cl.² .............................................. H05K 1/12
[52] U.S. Cl. .......................... 339/17 F; 339/176 MF
[58] Field of Search ........... 339/17 F, 17 LM, 17 LC, 339/176 MF

[56] References Cited

U.S. PATENT DOCUMENTS

| | | | |
|---|---|---|---|
| 3,234,499 | 2/1966 | Paholek et al. | 339/258 P |
| 3,432,794 | 3/1969 | Churla | 339/17 F |
| 3,633,152 | 1/1972 | Podmore | 339/17 F |
| 3,641,482 | 2/1972 | Bretting | 339/17 F |
| 3,795,885 | 3/1974 | Desso et al. | 339/17 F |

*Primary Examiner*—Neil Abrams
*Attorney, Agent, or Firm*—Russell J. Egan

[57] ABSTRACT

A connector assembly is disclosed for effecting electrical connection between a flat flexible cable and a flat surface, such as provided by the pads of a printed circuit board. The subject assembly includes a housing block which receives the cable along one side surface thereof and has the contacts engaged with the cable bent normal to the cable to lie adjacent a second continuous side of the housing. The housing also includes means to secure the cable in position and means to secure the assembly against a surface such as the above-mentioned printed circuit board.

7 Claims, 5 Drawing Figures

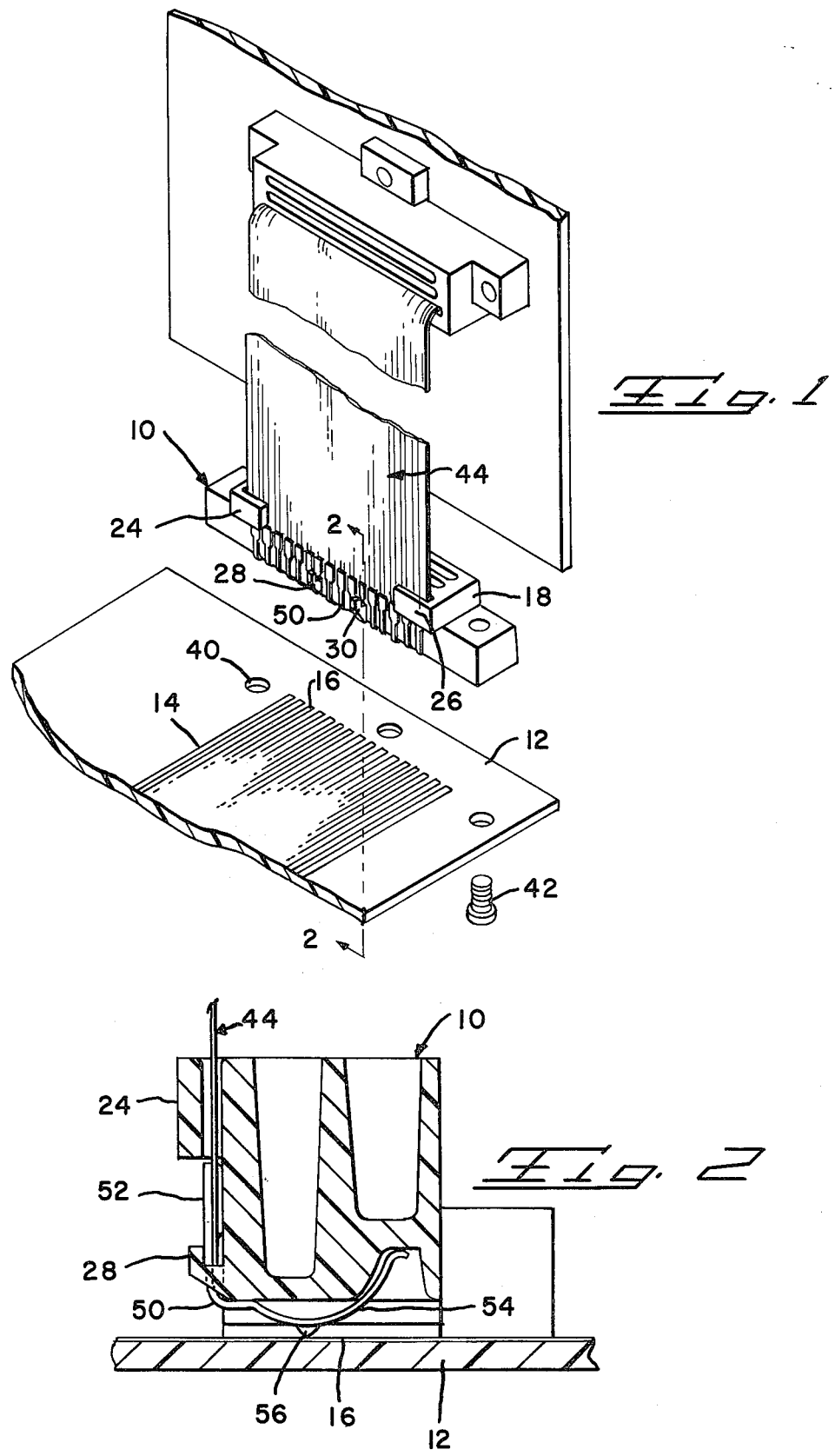

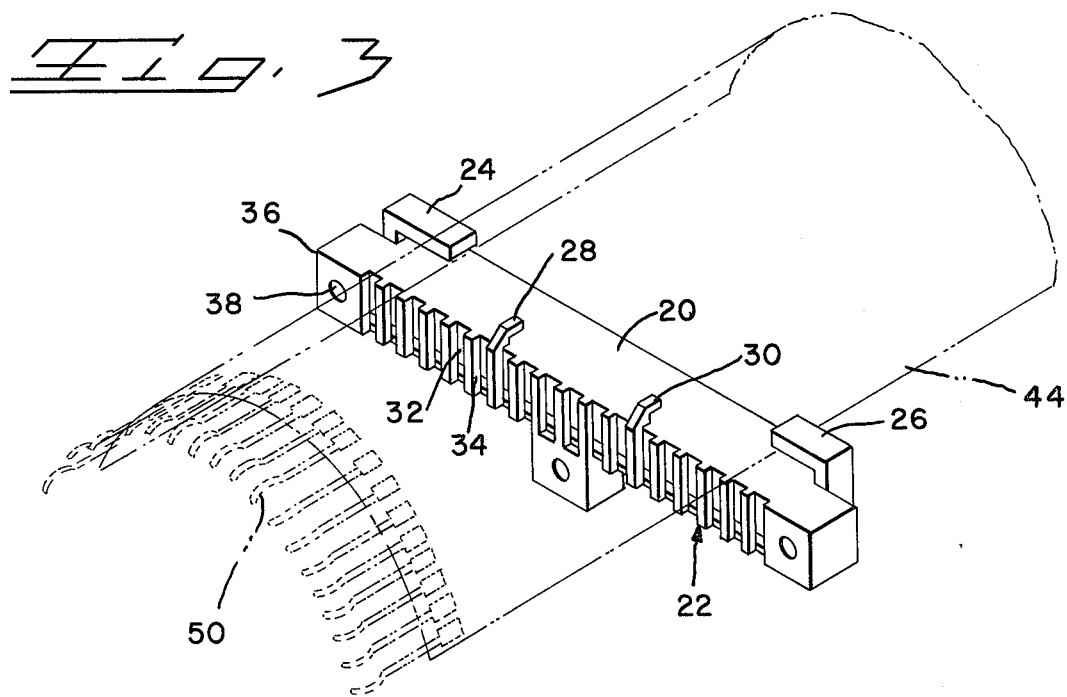
Fig. 3
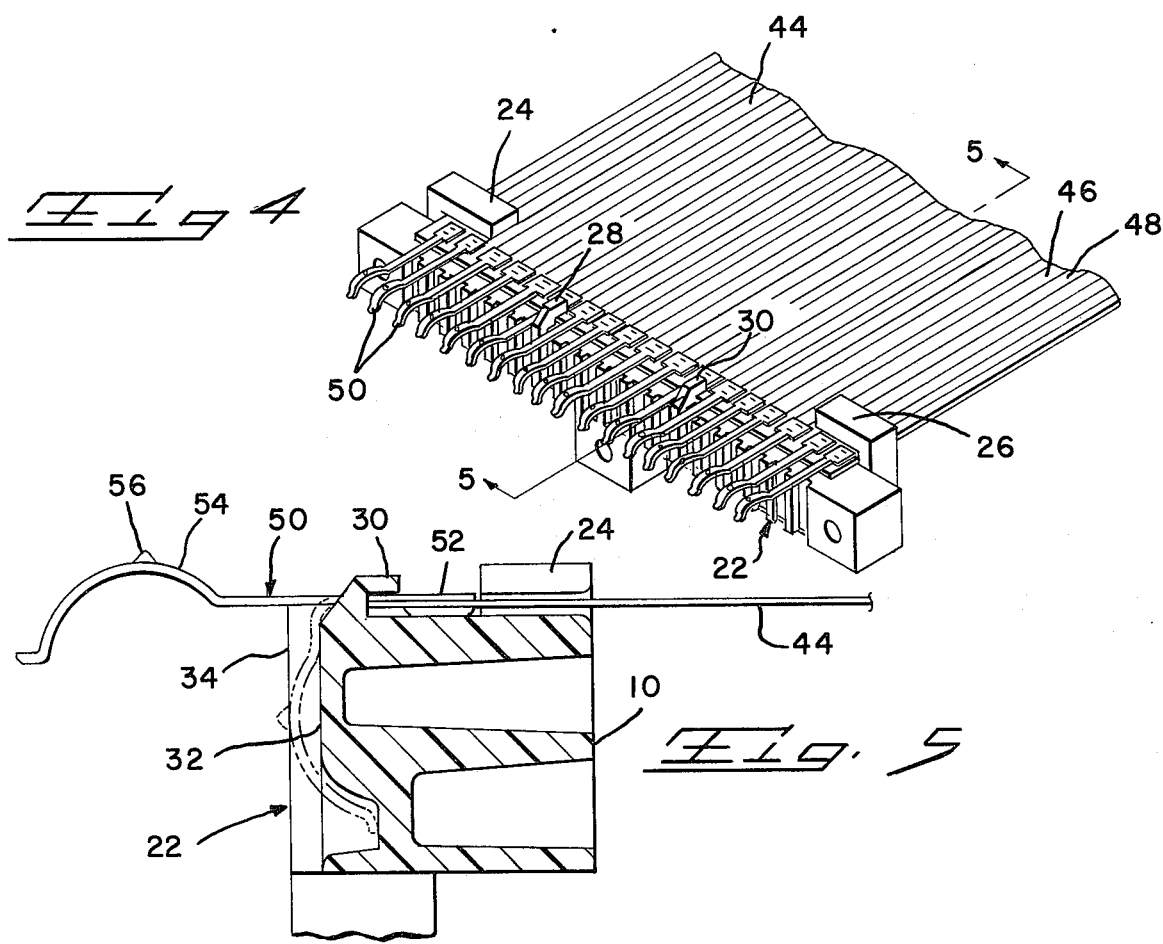
Fig. 4
Fig. 5

FLAT FLEXIBLE CABLE SURFACE MOUNT CONNECTOR ASSEMBLY

BACKGROUND OF THE INVENTION

1. The Field Of The Invention

The present invention relates to a connector assembly for making electrical interconnection between a flat flexible cable and a flat surface.

2. The Prior Art

There are many devices that are known for effecting electrical interconnection between members extending substantially normal to one another. For example, U.S. Pat. No. 3,129,990 shows an assembly which will effect such an electrical interconnection between mother/-daughter printed circuit boards. The connector assembly illustrated relies entirely upon the spring resiliency of the contact member to effect the desired connection.

A somewhat similar device is disclosed in U.S. Pat. No. 3,715,706 which discloses a right-angle electrical connector which can be used for flat flexible cable. Here again the device relies entirely upon the resiliency of the spring contact member to effect the desired connection. There is no permanent connection of the contact to the flat flexible cable.

A somewhat similar arrangement is shown in U.S. Pat. No. 3,745,895 in which the flash socket to effect electrical connection with a flexible control circuit which is fully supported on a rigid surface. Here again it is the resiliency of the contacts which is making the interconnection and which is relied upon.

U.S. Pat. No. 3,395,381 shows a type of crimp connection manufactured by the common assignee with the present application and is typical of the crimp connections produced for effecting an electrical interconnection with the individual conductors of a multiple conductor flat flexible cable.

SUMMARY OF THE INVENTION

The present invention makes a good electrical interconnection between the individual conductors of a flat flexible cable and a rigid substrate having a plurality of electrical pads thereon. The connector assembly includes a block having a cable supporting surface and an adjacent contact supporting surface extending normal to the cable supporting surface. The cable supporting surface includes means for engaging the cable to restrict the transverse and lateral movement thereof. The contact supporting surface includes a plurality of recesses adapted to receive the free ends of the contacts therein. A plurality of insulation displacing contacts are engaged with a flat flexible cable which is subsequently inserted into the connector housing on the cable contacting side and secured therein. The contacts are then formed at a right angle to rest in their respective recesses and thereby lockingly engage the cable in the connector. The connector assembly also includes means to fixedly secure the housing to the rigid circuit board or the like.

It is therefore an object of the present invention to produce an improved electrical connector assembly for effecting electrical interconnection between a rigid member and a flat flexible cable.

It is a further object of the present invention to produce an electrical connector assembly for flat flexible cable which receives the cable with the contacts thereof in a first position and the contacts are subsequently formed to a second position to lock the cable in the housing assembly.

It is a further object of the present invention to produce an electrical connector assembly which can be readily and economically manufactured.

The means for accomplishing the foregoing objects and other advantages of the present invention will be made apparent to those skilled in the art from the following detailed description taken with reference to the accompanying drawings.

BRIEF DESCRIPTION OF THE DRAWINGS

FIG. 1 is an exploded perspective view of the subject invention;

FIG. 2 is a vertical transverse view taken along line 2—2 of FIG. 1;

FIG. 3 is a schematic representation showing an initial step of assembly of the subject invention;

FIG. 4 is a perspective view, similar to FIG. 3, showing the cable initially engaged in the subject connector housing; and FIG. 5 is a vertical transverse section taken along line 5—5 of FIG. 4.

DETAILED DESCRIPTION OF THE PREFERRED EMBODIMENT

The subject connector assembly 10 is used to make a surface mount contact with a rigid member such as the printed circuit board 12 having a plurality of conductive paths 14 formed thereon by conventional means and ending at a connector area defined by a plurality of like parallel, aligned spaced pads 16 of conventional design. The connector assembly 10 includes a housing member 18 of insulating material which has on one side a cable receiving and supporting surface 20 and on an adjacent side a contact supporting surface 22 which is substantially normal to the cable supporting surface. A pair of lateral cable restraining flanges or tabs 24, 26 are fixed on the opposite ends of the cable supporting surface and at least one similar longitudinal restraining tabs or flanges 28, 30 is fixed to the housing adjacent the edge of the contact supporting surface 22. The contact supporting surface 22 has a plurality of profiled contact receiving grooves 32 formed therein separated by ribs 34. The housing also includes a number of mounting flanges 36 having bores 38 therein. These are spaced for alignment with similar apertures 40 in the plate 12 for the through passage of conventional locking securing means 42, such as screws or bolts. The unnumbered recesses are cavities provided for molding convenience and serve no other structural purpose.

The cable 44 is formed by a plurality of flat conductors 46 embedded in or laminated between layers of insulation 48, and is of the conventional type known as flat flexible cable.

The contacts 50 are stamped and formed from metal stock and include a crimp portion 52 and a bowed or arcuate surface engaging portion 54 which is preferably provided with a projection or dimple 56. The crimp portion has an insulation displacing crimping configuration such as the crimp shown in the above-mentioned U.S. Pat. No. 3,395,381. The metal stock can be either plated or unplated and includes a wide range of materials. The contacts 50 are initially formed as shown in FIGS. 4 and 5 and are subsequently bent to the configuration shown in FIGS. 1 and 2.

The connector is assembled by first crimping the contacts 50 onto the conductors of the cable 44 to extend from the end thereof in cantilever fashion, as shown in solid lines in FIG. 5. The cable 44, with the contacts 50 secured thereon, is bowed about its longitudinal axis, as shown in phantom in FIG. 3, and the margins thereof are inserted between the tabs 24, 26. At this time the end of the cable extends well beyond the housing member 18. The cable is then released and moved rearwardly until the front edge thereof clears the tabs 28, 30. The cable is then moved slightly forward to fully engage under these tabs, as shown in FIGS. 2 and 5. The contacts are then formed by bending the surface engaging portion 54 normal to the cable engaging portion 52, as shown in FIGS. 2 and 5. This also serves to lock the cable from being withdrawn rearwardly from the housing member 18. After the contacts are bent, the surface engaging portions 54 lie in their respective profiled grooves 32.

The connector assembly 10 is engaged with the rigid surface 12 by merely positioning the contacts 50 in alignment with the respective pads 16 and effecting the appropriate fixing by insertion of the means 42 through the respective holes 40 and 38.

The present invention is not restricted to the use of any particular materials but it should be noted that this type of contact will be especially effective with the use of tin-nickel plated connectors. The surface engaging portion can also be provided with a projection of various configurations which will help to penetrate any oxide layers that might be built up on the surface board.

The present invention may be subject to many changes and modifications without departing from the spirit or essential characteristics thereof. The present embodiment is therefore to be considered in all respects as illustrative and not restrictive of the scope of the invention.

What is claimed is:

1. A connector assembly for electrically interconnecting a plurality of conductors in a flat flexible circuit with a like plurality of conductors on a rigid surface comprising:
    an elongated electrical insulating block having first and second adjacent surfaces extending normal to each other,
    means on said first surface for engaging end and side edges of a cable so as to restrain both the longitudinal and lateral motion thereof;
    a like plurality of parallel spaced contact receiving recesses in said second surface extending from and normal to said first surface;
    means to detachably mount said insulating block on said rigid surface; and
    a plurality of electrical contacts formed of resilient conductive material having on a first end means for engaging respective conductors of said cable and lying along said first surface and on the opposite end a surface engaging portion bent in the plane of the contact to extend substantially normal to said first end to lie in said recesses in said second surface with a bowed configuration projecting at least partially from said recesses to resiliently engage said conductors on said rigid surface, each said bowed portion including an embossed rib extending therealong.

2. An electrical connector for connecting in electrical circuit relationship a cable to a circuit board, said cable being a flexible insulating web having a plurality of generally parallel flat conductors therein in predetermined fixed spaced relationship, and said circuit board being a rigid insulating board having an electrical circuit thereon which includes a plurality of conducting paths arranged in generally parallel, regularly spaced relationship along a termination portion of said board, said electrical connector comprising:
    an elongated housing of insulation material having a cable supporting first side and an adjacent contact supporting second side;
    means on said cable supporting first side to engage end and side edges of said cable allowing only limited longitudinal and lateral movement thereof;
    a plurality of parallel, regularly spaced contact receiving recesses in said second side extending from and normal to said first side; and
    a plurality of electrical contacts formed of resilient conductive material each having an insulation displacing conductor engaging first end portion and a resilient board engaging second end portion extending generally normal to the plane of said first portion and having a generally bowed configuration with an embossed rib extending along at least a portion of said bow, the first end of said contacts being crimp connected to the respective conductors of said cable, the second end of said contact being received in the respective recesses and engaging the respective conducting paths of said circuit board.

3. An electrical connector according to claim 2 wherein said means on said cable supporting side to engage end and side edges of said cable allowing only limited longitudinal movement comprises:
    a flange on said first side adjacent an edge thereof joining said second side, said flange being directed along said first side away from said edge.

4. An electrical connector according to claim 2 wherein said means on said cable supporting side to engage end and side edges of said cable allowing only limited lateral movement comprises:
    an inwardly directed flange on each opposite end of said first side.

5. An electrical connector according to claim 2 wherein said means on said cable supporting side to engage end and side edges of said cable allowing only limited longitudinal and lateral movement comprises:
    at least one first flange on said first side adjacent an edge thereof joining said second side, said flange being directed along said first side away from said edge, and
    an inwardly directed second flange on each opposite lateral end of said first side.

6. An electrical connector according to claim 2 further comprising:
    means for detachably securing said connector housing to said circuit board.

7. An electrical connector according to claim 2 wherein said contacts have an initial substantially planar configuration and a final configuration including a substantially 90° bend in said plane between said first and said second portions, said contacts being connected to said cable conductors in said initial configuration and bent to said final configuration after said cable is mounted on said housing whereby said cable is locked into said housing.

* * * * *